US011914267B2

(12) United States Patent
Shakfa et al.

(10) Patent No.: US 11,914,267 B2
(45) Date of Patent: Feb. 27, 2024

(54) TUNABLE MID-INFRARED LASER SOURCE AND METHOD

(71) Applicants: KING ABDULLAH UNIVERSITY OF SCIENCE AND TECHNOLOGY, Thuwal (SA); POLITECNICO DI MILANO, Milan (IT)

(72) Inventors: Mohammad Khaled Shakfa, Thuwal (SA); Marco Lamperti, Lecco (IT); Marco Marangoni, Lecco (IT); Aamir Farooq, Thuwal (SA)

(73) Assignees: KING ABDULLAH UNIVERSITY OF SCIENCE AND TECHNOLOGY, Thuwal (SA); POLITECNICO DI MILANO, Milan (IT)

( * ) Notice: Subject to any disclaimer, the term of this patent is extended or adjusted under 35 U.S.C. 154(b) by 406 days.

(21) Appl. No.: 17/307,087

(22) Filed: May 4, 2021

(65) Prior Publication Data
US 2021/0349371 A1 Nov. 11, 2021

Related U.S. Application Data

(60) Provisional application No. 63/020,132, filed on May 5, 2020.

(51) Int. Cl.
*G02F 1/35* (2006.01)
*G02F 1/355* (2006.01)
(Continued)

(52) U.S. Cl.
CPC ............ *G02F 1/3505* (2021.01); *G01J 3/108* (2013.01); *G02F 1/3503* (2021.01);
(Continued)

(58) Field of Classification Search
None
See application file for complete search history.

(56) References Cited

U.S. PATENT DOCUMENTS 8,331,017 B2 * 12/2012 Suchowski ........... G02F 1/3534
359/326
10,082,720 B2 * 9/2018 Takahashi ............... G02F 1/353
(Continued)

FOREIGN PATENT DOCUMENTS

WO WO-2018045701 A1 * 3/2018 ............... G02F 1/35

OTHER PUBLICATIONS

Beutler, M., et al., "Difference-Frequency Generation of Ultrashort Pulses in the Mid-IR Using Yb-Fiber Pump Systems and AgGaSe2," Optics Express, Jan. 30, 2015, vol. 23, No. 3, pp. 2730-2736, OSA.
(Continued)

*Primary Examiner* — Rhonda S Peace
(74) *Attorney, Agent, or Firm* — PATENT PORTFOLIO BUILDERS PLLC

(57) ABSTRACT

A laser source includes a first laser device configured to generate a first laser beam having a first wavelength, a second laser device configured to generate a second laser beam having a second wavelength, which is different from the first wavelength, and a non-linear crystal configured to receive simultaneously the first and second laser beams and to generate a third laser beam that has a third wavelength, which is larger than each of the first and second wavelengths. The non-linear crystal has a length and a width, and a variable poling period is distributed across the width so that the third wavelength varies within a given wavelength range based on an incident position of the first and second laser beams along the width of the non-linear crystal.

19 Claims, 15 Drawing Sheets

(51) Int. Cl.
H01S 5/00 (2006.01)
H01S 3/00 (2006.01)
H01S 3/223 (2006.01)
H01S 5/14 (2006.01)
G01J 3/10 (2006.01)
H01S 5/34 (2006.01)

(52) U.S. Cl.
CPC .......... G02F 1/3551 (2013.01); G02F 1/3556 (2013.01); G02F 1/3558 (2013.01); H01S 3/0092 (2013.01); H01S 3/2232 (2013.01); H01S 5/0092 (2013.01); H01S 5/14 (2013.01); H01S 5/3402 (2013.01); *G02F 2202/101* (2013.01); *G02F 2203/11* (2013.01)

(56) References Cited

U.S. PATENT DOCUMENTS

| | | | | |
|---|---|---|---|---|
| 10,599,008 | B1* | 3/2020 | Ma | G02F 1/3558 |
| 10,866,486 | B2* | 12/2020 | Mueller | G02F 1/3551 |
| 11,009,773 | B2* | 5/2021 | Zhong | G02F 1/39 |
| 2008/0044147 | A1* | 2/2008 | Patel | G02F 1/3558 |
| | | | | 385/37 |
| 2008/0107141 | A1* | 5/2008 | Ma | G02F 1/3775 |
| | | | | 372/21 |
| 2011/0043895 | A1* | 2/2011 | Hikmet | G02F 1/3775 |
| | | | | 359/328 |
| 2018/0067376 | A1* | 3/2018 | Takahashi | G02F 1/3551 |
| 2020/0041869 | A1* | 2/2020 | Mueller | G02F 1/3558 |
| 2021/0349371 | A1* | 11/2021 | Shakfa | H01S 5/0092 |

OTHER PUBLICATIONS

Honzátko, P., et al., "Coherent Sources for Mid-Infrared Laser Spectroscopy," Proceedings of SPIE 10142, 20th Slovak-Czech-Polish Optical Conference on Wave and Quantum Aspects of Contemporary Optics, Dec. 2016, pp. 1014202-1-1014202-15.

Razeghi, M., "High Power, High Wall-Plug Efficiency, High Reliability, Continuous-Wave Operation Quantum Cascade Lasers at Center for Quantum Devices," Proceeding of SPIE 11296, Optical, Opto-Atomic, and Entanglement-Enhanced Precision Metrology II, Feb. 25, 2020, 112961C-1-112961C-15.

Vainio, M., "Continuous-Wave Optical Parametric Oscillators for Mid-Infrared Spectroscopy," Proceedings of SPIE 1126, Nonlinear Frequency Generation and Conversion: Materials and Devices XIX, Mar. 2, 2020, pp. 1126419-1-1126419-8.

Vitiello, M.S., et al., "Quantum Cascade Lasers: 20 Years of Challenges," Optics Express, Feb. 23, 2015, vol. 23, No. 4, pp. 5167-5182.

* cited by examiner

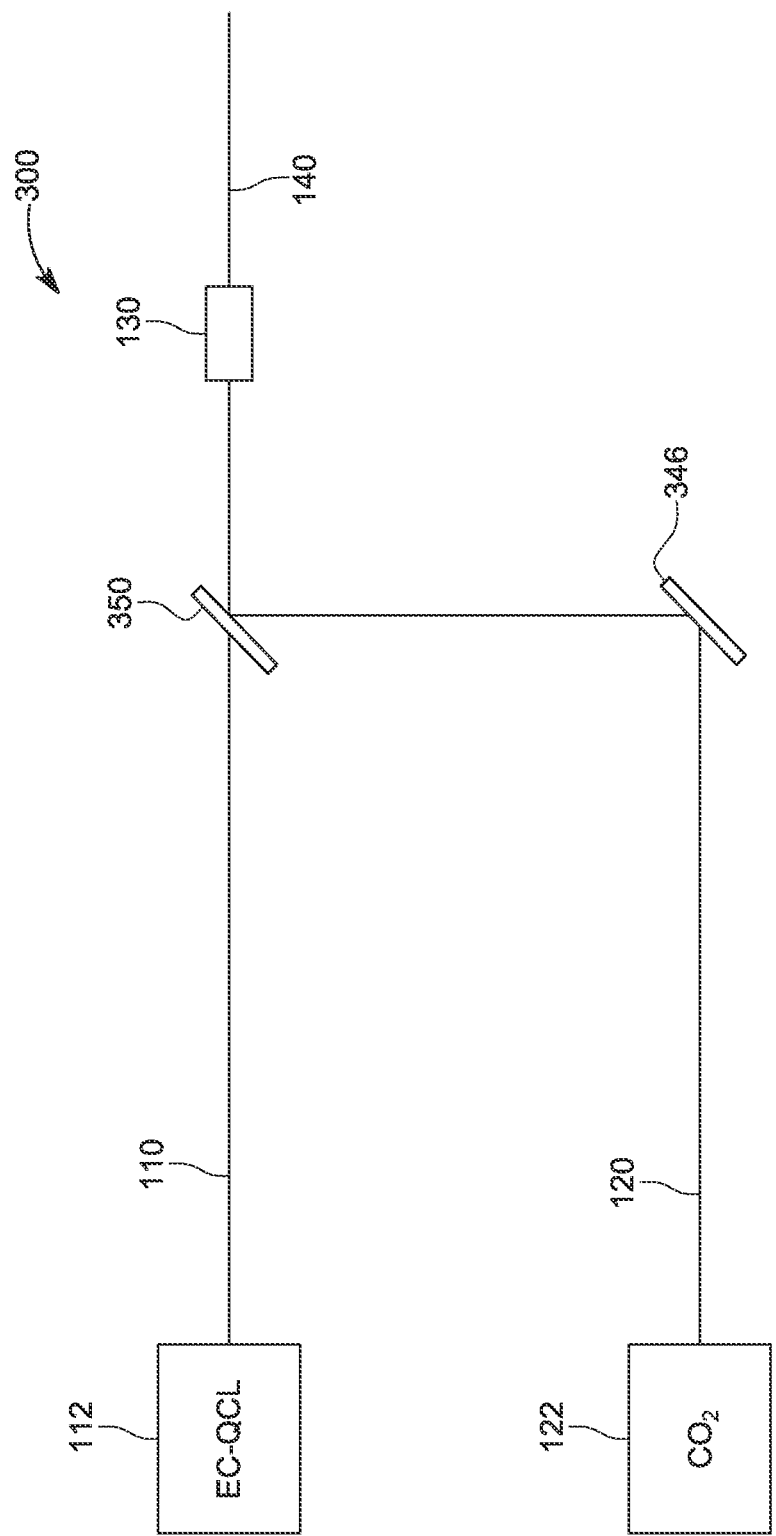

TUNABLE MID-INFRARED LASER SOURCE AND METHOD

CROSS-REFERENCE TO RELATED APPLICATIONS

This application claims priority to U.S. Provisional Patent Application No. 63/020,132, filed on May 5, 2020, entitled "TUNABLE MID-INFRARED LASER SOURCE EMITTING BETWEEN 12.6 AND 15 µm," the disclosure of which is incorporated herein by reference in its entirety.

BACKGROUND

Technical Field

Embodiments of the subject matter disclosed herein generally relate to a method and system for delivering a tunable laser beam in the mid-infrared (MIR) range, and more particularly, to a tunable MIR laser source for high-resolution spectroscopy.

Discussion of the Background

The capability of resolving individual absorption features is of high importance in many applications, including molecular spectroscopy and metrology. In this context, MIR is an attractive spectral region because it contains strong, fingerprint vibrational bands of many species of interest in many applications, such as air quality monitoring and medical and combustion diagnostics. Light absorption by these MIR bands can be uniquely exploited as a nearly universal tool for high-sensitivity detection of gaseous chemical species. For example, the strongest absorption bands of the aromatic hydrocarbons of BTX mixture (benzene, toluene, and xylene isomers) in the IR range are among the wavelengths between 12.5 and 15 µm. Thus, a laser device that can emit a laser beam tunable to achieve any wavelength in this range is desired.

Fourier transform infrared (FTIR) spectrometry has been a gold standard technique for infrared spectroscopy applications. However, the spectral resolution of FTIR spectrometers is relatively low due to the limited scanning range of mechanical delay lines and due to the poor spatial and spectral coherence of thermal light sources. Alternatively, optical frequency combs can be used as a light source for FTIR spectroscopy with high resolution and accuracy. Optical frequency combs provide a series of narrow linewidth teeth over a broad spectral bandwidth. While optical frequency combs offer high resolution and absolute frequency calibration, the spacing between the comb teeth is often of the order of a few hundred MHz. This is relatively a high-spacing when detecting narrow absorption features.

Continuous-wave (cw) lasers can overcome this issue and have been widely used for MIR spectroscopy applications. However, the longest wavelength from semiconductor diode and disk lasers is less than 5 µm. Furthermore, MIR fiber lasers reach wavelengths only up to 3.5 µm. Quantum cascade lasers (QCLs) cover a wide MIR range with a very good beam quality, a narrow laser linewidth, and high output power. However, commercial QCLs beyond 13.6 µm are still at a prototype level. In contrast, nonlinear frequency conversion based lasers, including optical parametric oscillation [1] and difference-frequency generation (DFG) [2], provide broad tunability and can be designed to target specific MIR regions with wide spectral bandwidth and tunability [3]. However, the commercially existing light sources still do not achieve the desired tunability in the 11 to 15 µm wavelength range.

Thus, there is a need for a new laser source tunable in the aforementioned MIR range with relatively high output power and a narrow laser linewidth.

BRIEF SUMMARY OF THE INVENTION

According to an embodiment, there is a laser source that includes a first laser device configured to generate a first laser beam having a first wavelength; a second laser device configured to generate a second laser beam having a second wavelength, which is different from the first wavelength; and a non-linear crystal configured to receive simultaneously the first and second laser beams and to generate a third laser beam that has a third wavelength, which is larger than each of the first and second wavelengths. The non-linear crystal has a length and a width, and a variable poling period is distributed across the width so that the third wavelength varies within a given wavelength range based on an incident position of the first and second laser beams along the width of the non-linear crystal.

According to another embodiment, there is a method for generating a mid-infrared laser beam with a laser source and the method includes injecting a first laser beam having a first wavelength into a non-linear crystal; injecting a second laser beam having a second wavelength, which is different from the first wavelength, into the non-linear crystal; and moving the non-linear crystal, perpendicular to the first and second laser beams, to generate a third laser beam that has a third wavelength, which is larger than each of the first and second wavelengths. The non-linear crystal has a length and a width, and a variable poling period is distributed across the width so that the third wavelength varies within a given wavelength range.

According to yet another embodiment, there is sensing system that includes a laser source configured to generate a mid-infrared laser beam based on (1) a first laser device, which generates a first laser beam having a first wavelength, (2) a second laser device, which generates a second laser beam having a second wavelength, which is different from the first wavelength, and (3) a non-linear crystal that receives simultaneously the first and second laser beams and generates a mid-infrared laser beam having a third wavelength, which is larger than each of the first and second wavelengths; a moving mechanism configured to move the non-linear crystal along a direction perpendicular to the first and second laser beams to change the third wavelength; a chamber configured to receive a chemical element to be measured, wherein the mid-infrared laser beam is configured to enter the chamber; and a sensor configured to receive the mid-infrared laser beam after exiting the chamber and also configured to determine a wavelength or intensity of the mid-infrared laser beam.

BRIEF DESCRIPTION OF THE DRAWINGS

For a more complete understanding of the present invention, reference is now made to the following descriptions taken in conjunction with the accompanying drawings, in which:

FIGS. 3A and 3B illustrate different configurations of the laser source that generates the third laser beam in the mid-infrared region;

DETAILED DESCRIPTION OF THE INVENTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a first laser, which is an external-cavity quantum cascade laser, and a second laser, which is a $CO_2$ gas laser, for generating a laser beam that covers a wide MIR range. However, the embodiments to be discussed next are not limited to these two types of lasers, but may be applied to other types of lasers. For example, the first laser device may be a carbon monoxide (CO) gas laser and the second laser device may be a distributed-feedback quantum cascade laser. In another application, both laser devices are external cavity quantum cascade lasers or distributed-feedback quantum cascade lasers. In still another application, the first laser device is an external cavity quantum cascade laser, and the second laser device is a distributed-feedback quantum cascade laser, or vice versa.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, a widely tunable MIR laser source is based on the difference frequency generation (DFG) process between two different laser sources. The DFG process is realized in one embodiment with a non-linear, orientation-patterned GaAs crystal so that the resulting idler spectral range is between 667 and 865 $cm^{-1}$ with a linewidth of about 2.3 MHz and an output power of up to about 31 µW.

Figure 1:
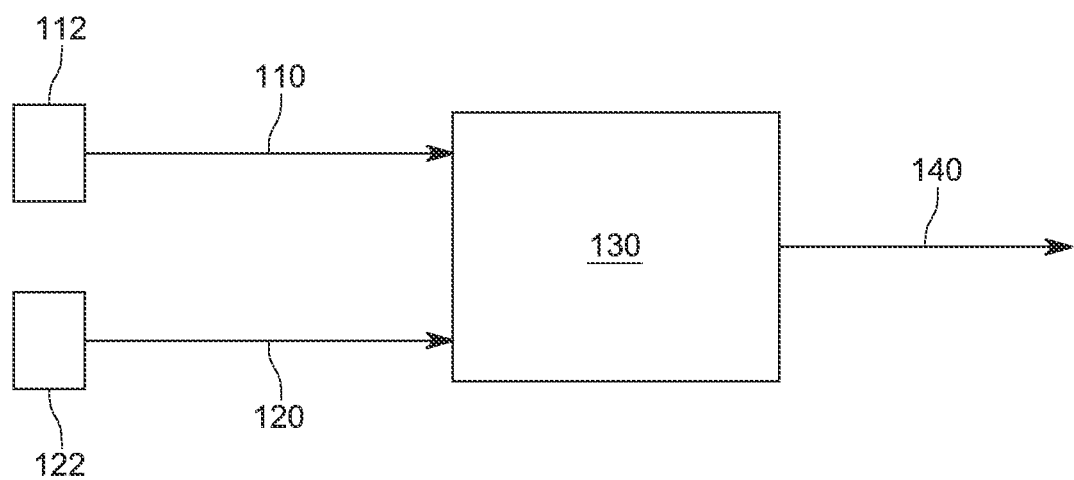
FIG. 1 is a schematic diagram of a laser source that combines two different laser beams in a non-linear crystal to generate a third laser beam having a higher wavelength than each of the first and second laser beams.

DFG based on nonlinear frequency down-conversion in nonlinear crystals, is an effective approach to realize tunable MIR laser sources. In the DFG process, two laser beams 110 and 120, as illustrated in FIG. 1, with different frequencies, are combined and focused in a non-linear crystal 130 to generate another laser beam 140, with a new frequency that is the difference between the frequencies of the two original laser beams 110 and 120. The laser beams 110 and 120 incident into the non-linear crystal 130 are typically called pump and signal, respectively, also first and second laser beams, where the pump laser frequency ($v_p$) is greater than the signal laser frequency ($v_s$). The new laser beam 140 resulting from the DFG process is called idler, also called the third laser beam herein, and it has a frequency $v_i = v_p - v_s$.

In one embodiment, the first laser beam 110 is generated from an external-cavity quantum cascade laser (EC-QCL) 112, as the pump source, and the second laser beam 120 is generated with a $CO_2$ gas laser 122, as the signal source. The non-linear crystal 130 is in this embodiment a non-linear orientation-patterned (OP) GaAs crystal. Other materials, with high transparency to the wavelengths of pump, signal and idler lasers, may be used as would be recognized by those skilled in the art. The $CO_2$ gas laser may be operated in a kHz-pulsed mode, while the EC-QCL laser may be operated in a continuous mode-hop-free manner. This configuration results in a quasi-cw idler emission between 666.53-865.28 $cm^{-1}$ (11.56-15 µm) with a laser linewidth of about 2.3 MHz and a spectral spacing in the MHz range.

Among nonlinear crystals, OP—GaAs has been highly attractive for MIR DFG-based laser sources due to its large nonlinear susceptibility, lack of birefringence, wide transparency range (0.9-17 µm), high thermal conductivity, and high laser-damage-threshold [4, 5]. The OP—GaAs 130 used in this embodiment is shown in more detail in FIG. 2, and has plural poling periods. A poling period is determined by the structure of the OP—GaAs 130, which includes first regions 132 of GaAs having a first crystallographic orientation, e.g., (001) and second regions 134 of GaAs having a second crystallographic orientation, e.g., (00$\underline{1}$), which is opposite to the first crystallographic orientation. The first and second regions 132 and 134 are shown in the figure to be shaped like slices, which are alternately distributed side by side, and extend through the entire height of the non-linear crystal. Note that the term "crystal orientation" is used herein to describe the alignment of the crystals within a given specimen, and the crystal orientation is defined as the rotation that maps the specimen coordinate system onto the crystal coordinate system.

Figure 2:
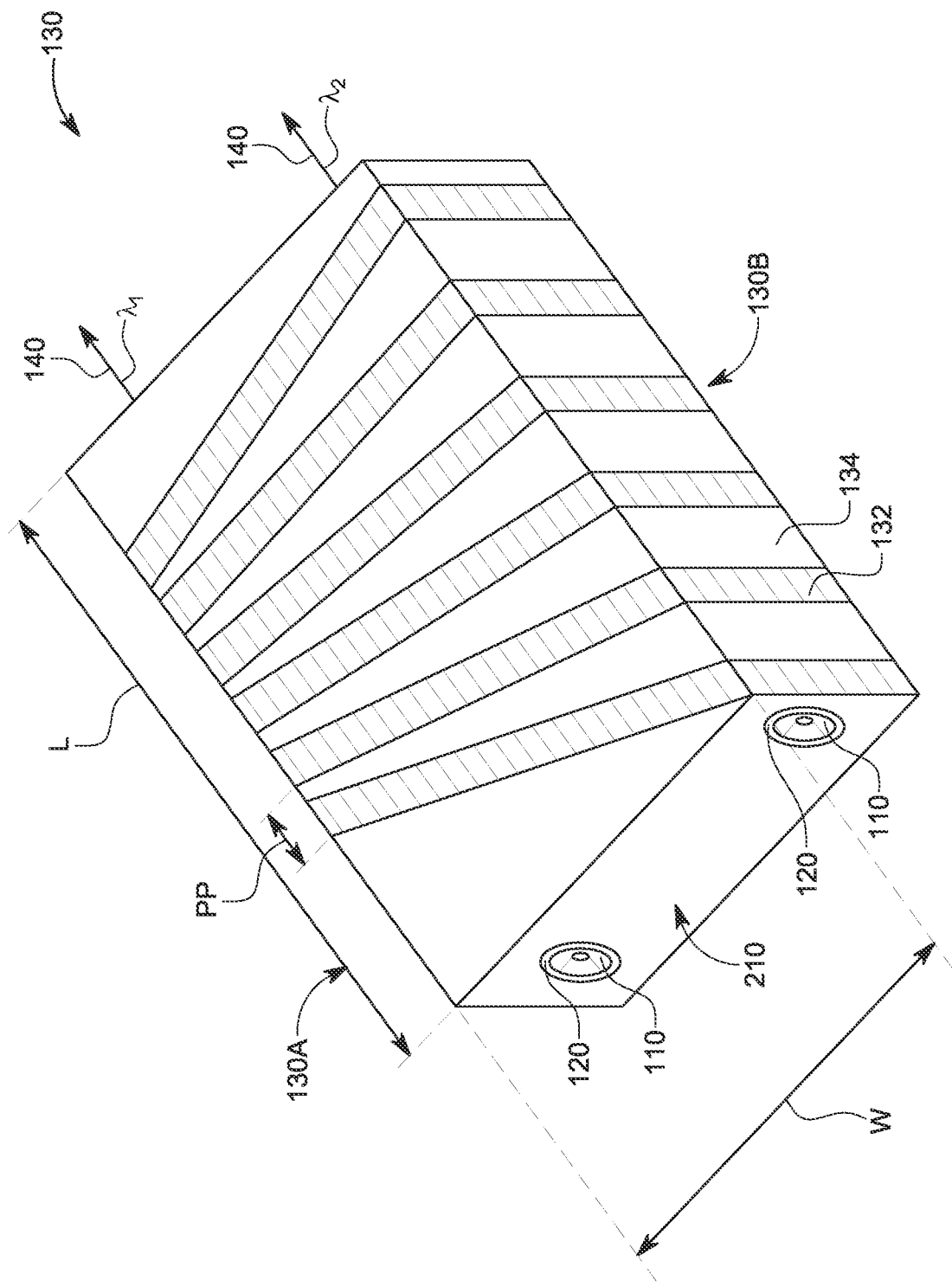
FIG. 2 illustrates a fan-out configuration of the non-linear crystal that achieves the third laser beam.

The specific structure shown in FIG. 2 has a fan-out configuration, with a poling period PP, i.e., a distance between two consecutives regions 132 or regions 134 being PP. A value of PP varies in this embodiment from about 183 µm, at one side 130A of the OP—GaAs crystal 130, to about 203 µm, to the opposite side 130B of the crystal. This means that when the two incoming laser beams 110 and 120 enter the crystal 130, toward the side 130A with the small poling period PP, a first resulting idler wavelength $\lambda_1$ is obtained, while when the two incoming laser beams 110 and 120 enter the crystal 130, toward the other side 130B with the large poling period PP, a second resulting idler wavelength $\lambda_2$ is obtained. For example, the first resulting wavelength can be 11.5 µm and the second resulting wavelength can be 15 µm. For any other position 210 of the two combined laser beams 110 and 120 between the sides 130A and 130B of the crystal 130, the resulting wavelength will have a value between 11.56 and 15 μm. Thus, by controlling an incident position of the first and second laser beams on the non-linear crystal 130, any wavelength in the above noted range can be generated with this laser source.

The length L and the width W of the crystal 130 are selected so that together with the poling periods and the frequencies of the first and second laser beams 110, 120, generate the resulting laser beam 140, which has a wavelength between 11.56 and 15 μm. For example, it is possible that the length L is about 35 mm and the width W is about 20 mm. For these sizes of the crystal 130, for a wavelength of about 5.45 to 5.71 μm for the first laser beam 110, and for a wavelength of about 9.23 to 10.86 μm for the second laser beam 120, the inventors have obtained the resulting laser beam 140 to have the wavelength between 11.56 and 15 μm. Those skilled in the art would be inspired by these examples to further modify the wavelengths of the first and second beams and also the sizes of the crystal 130 and the poling periods PP to obtain other wavelengths for the resulting laser beam 140.

Figure 3A:
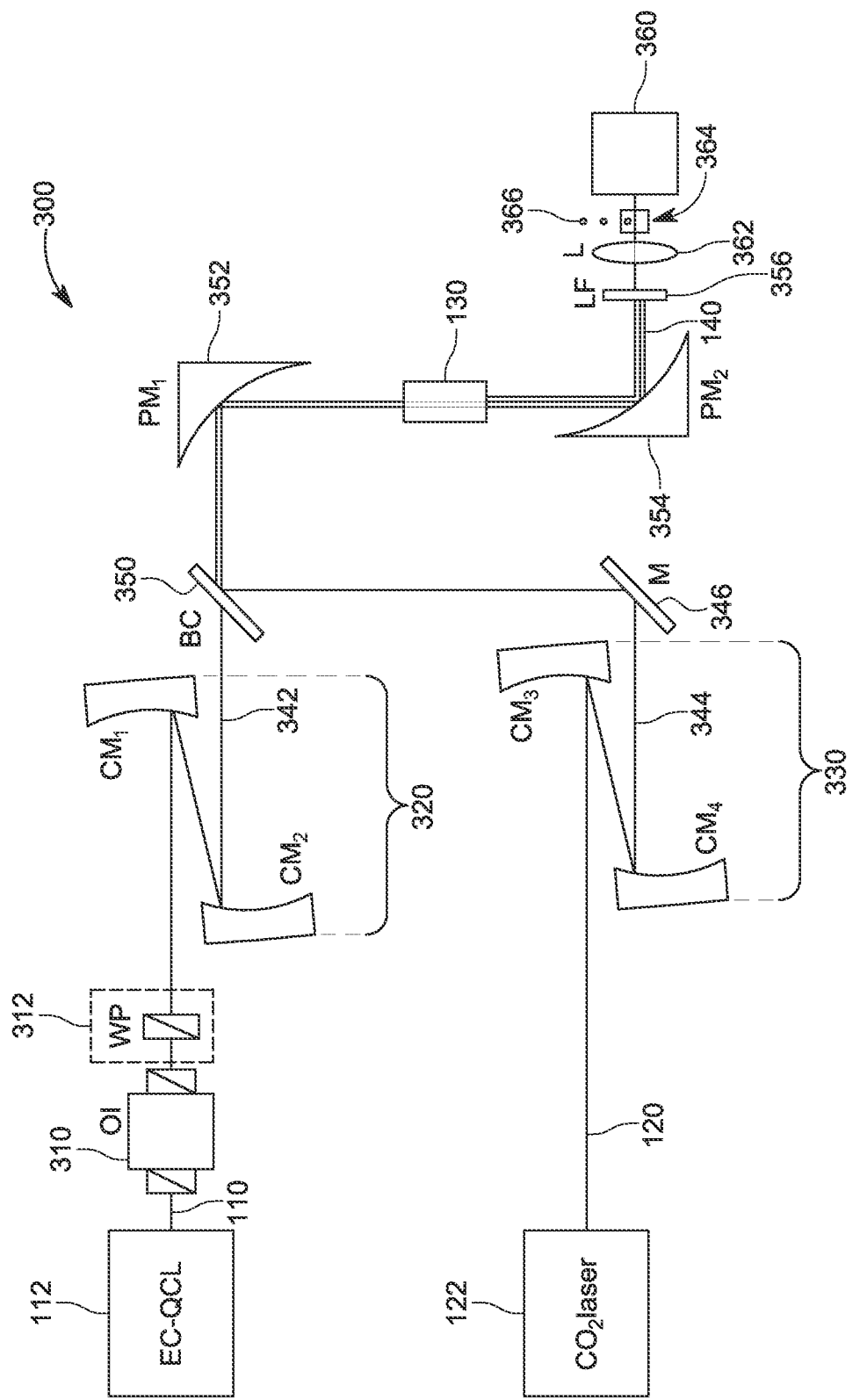
Figure 4:
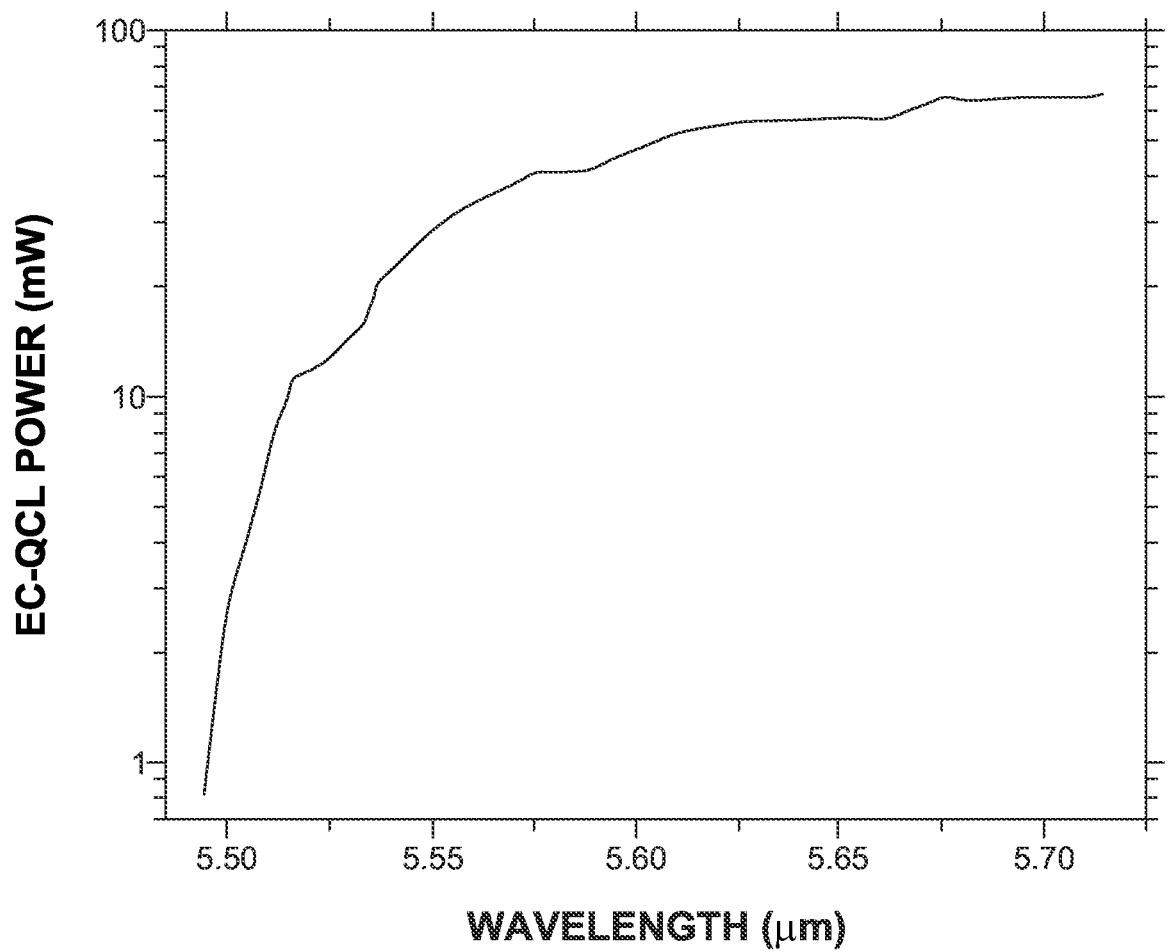
FIG. 4 illustrates the output power of a quantum cascade laser that is used in the laser source.

FIG. 3A illustrates an embodiment in which a laser source 300, which has the configuration discussed with regard to FIG. 1, is shown to include the pump laser 112, which is an EC-QCL with single-mode emission between 5.45 and 5.71 μm with an output power of up to 200 mW, and the signal laser 122, which is a pulsed $CO_2$ gas laser tunable between 9.23 and 10.86 μm with an optical power up to 10 W at its most intense lines (at a repetition rate of 2.5 kHz and a duty cycle of 25%). Both the pump and signal lasers have vertical polarization in this embodiment, with a line width of 1.7 MHz and 1.5 MHz, respectively, as retrieved from the beat-note with a 100 kHz linewidth frequency comb (see, for example, Lamperti, M., Gotti, R., Gatti, D., Shakfa, M. K., Cané, E., Tamassia, F., Schunemann, P., Laporta, P., Farooq, A. and Marangoni, M., "Optical frequency metrology in the bending modes region," Commun. Phys., 3 (1), (2020). https://doi.org/10.1038/s42005-020-00441-y). FIG. 4 shows the output power of the EC-QCL laser 112 across its tuning wavelength range.

The first laser beam 110 is configured in this embodiment to pass through an optical isolator (OI) 310 to suppress any back reflections that may damage the EC-QCL. However, this element can be omitted. These back reflections mainly come from the facets of the OP—GaAs crystal 130. The OI may cause about 50% drop in the laser power and rotates the polarization of the pump laser by 45°. Thus, a waveplate (WP) 312 may be installed after the OI to maintain the vertical polarization of the first laser beam 110. As a result, the idler laser beam 140's power is increased by a factor of two, compared to its value without the WP.

Two sets 320 and 330 of concave mirrors ($CM_1$, and $CM_2/CM_3$ and $CM_4$) may be used to optimize the beam waists of the pump and signal laser beams incident on the OP—GaAs crystal to maximize the DFG efficiency. The optimized pump and signal laser beams 342 and 344 are then aligned through a beam combiner (BC) 350, also using a flat mirror 346, and focused onto the anti-reflection-coated OP—GaAs crystal 130 by a parabolic mirror ($PM_1$) 352. A second $PM_2$ 354 may be used to collect the idler laser beam 140 after the OP—GaAs crystal 130. A long-pass filter (LF) 356 may be placed after the $PM_2$ 354 to eliminate both the pump and signal beams. To obtain the idler laser beam power, the laser beam 140 is directly focused onto a liquid-nitrogen-cooled HgCdTe detector 360 using a KBr lens (L) 362. More or less elements may be used with the two lasers 112 and 122 and the crystal 130 to adjust/improve/modify the resulting laser beam 140. However, one skilled in the art would understand, based on this description, that elements 112, 122 and 130 are the minimal configuration for obtaining the widely tunable MIR laser beam 140. Further, the configuration shown in FIG. 3A may be provided with a chamber 364, located downstream of the crystal 130 and upstream from the sensor 360 so that a chemical element 366, which is sampled from an environment of interest (such as open air, combustion chamber, breath sample, etc.), can enter into the chamber 364 and interact with the laser beam 140. This interaction can modify the intensity of the laser beam 140, which can be detected with the sensor 360. As each chemical element 366 has its own signature when interacting with a laser beam, a processor (discussed later) connected to the sensor 360 may be used for identifying the chemical element. For this configuration, the sensor 360 may be an HgCdTe detector and the chamber 364 may be a shock-tube or an optical cell. Other configurations may be used for the chamber 364 and sensor 360, depending on the measured chemical element or compound. The alternative embodiment illustrated in FIG. 3B shows the laser source 300 devoid of most of the optional elements.

Figure 5A:
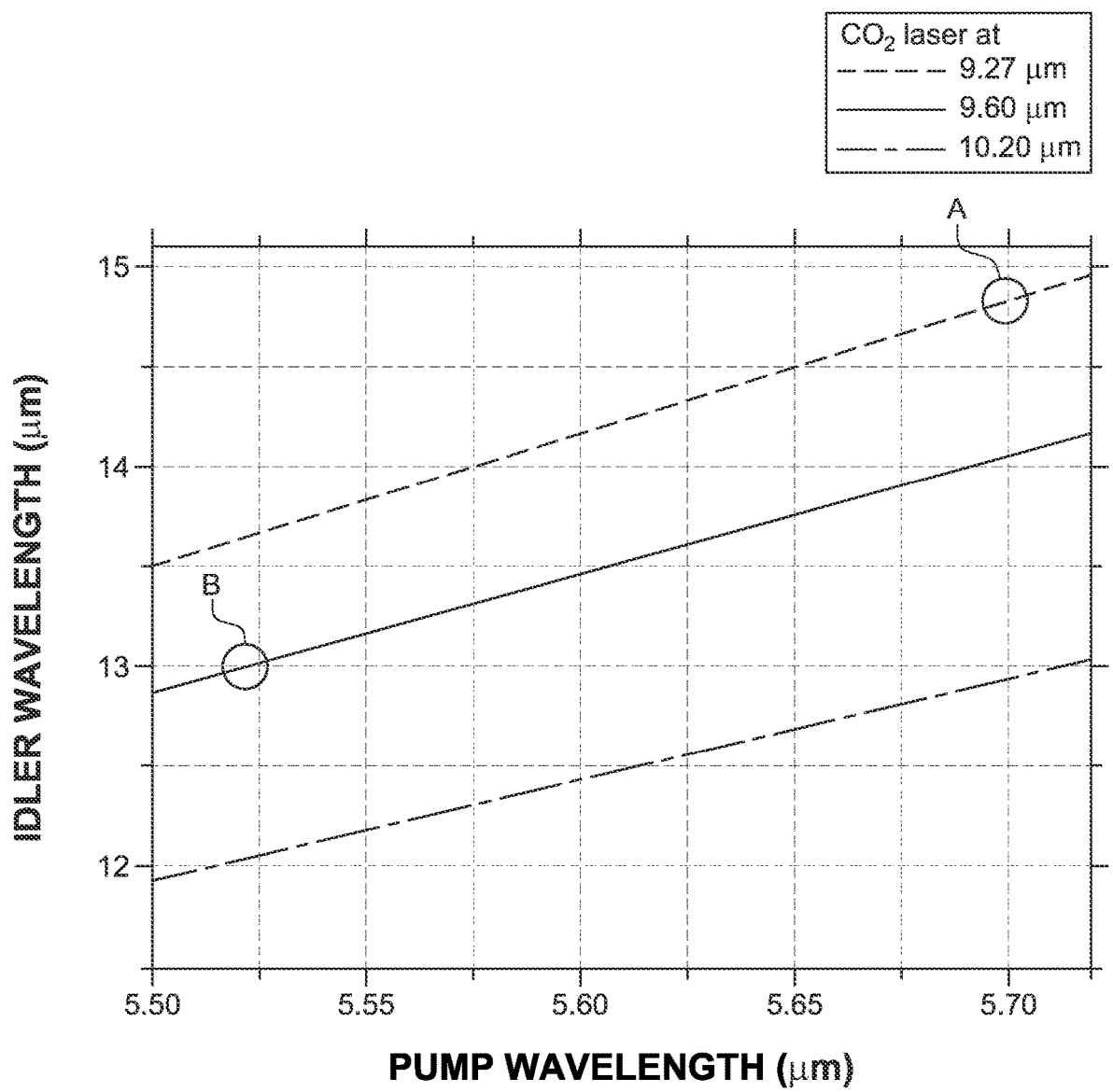
FIGS. 5A and 5B illustrate the idler wavelength and the poling period of the non-linear crystal as a function of the pump wavelength at different signal wavelengths.
Figure 5B:
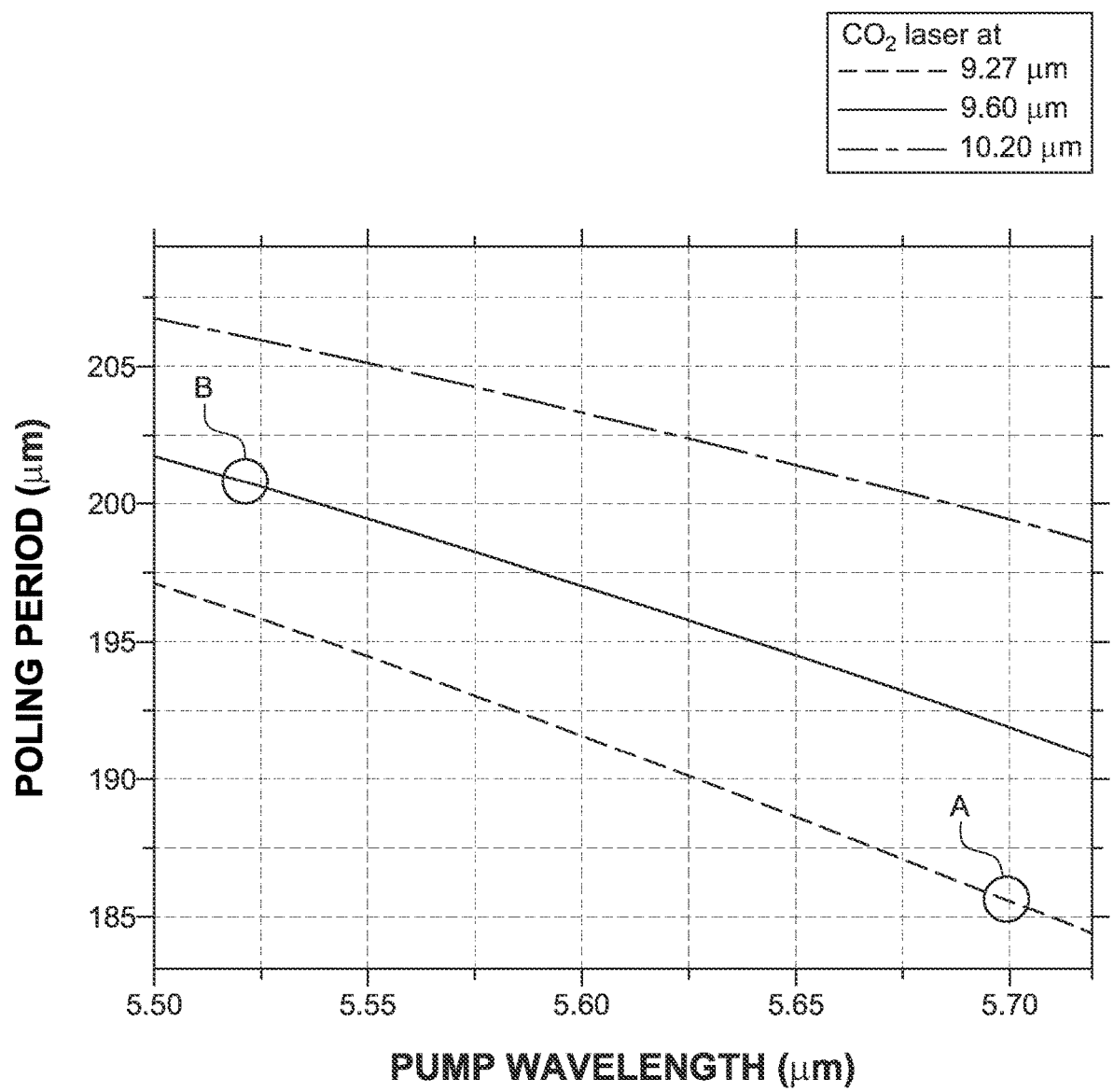

The length L of the OP—GaAs was selected in this embodiment to be about 35 mm and the poling periods were selected to be 183 μm at one side and 203 μm at the other side of the crystal 130. This selection ensures a phase matching of the two laser beams 110 and 120 over the entire tuning range of the pump (and thus idler) laser. In this regard, FIGS. 5A and 5B show a few curves of idler wavelength and poling-period of the OP—GaAs crystal, respectively, as a function of the pump wavelength at different signal wavelengths ($CO_2$ laser lines). For example, to get an idler wavelength close to 14.8 μm (see point A in FIG. 5A) when the pump and signal wavelengths are set to 5.7 μm and 9.27 μm, respectively, the poling period should be of 185.5 μm (see point A in FIG. 5B). If it is desired to shift the idler wavelength down to 13 μm (see point B in FIG. 5A), then it is necessary to tune the pump wavelength down to 5.52 μm and move the crystal 130 until the poling period is about 201 μm (see point B in FIG. 5B).

Figure 6:
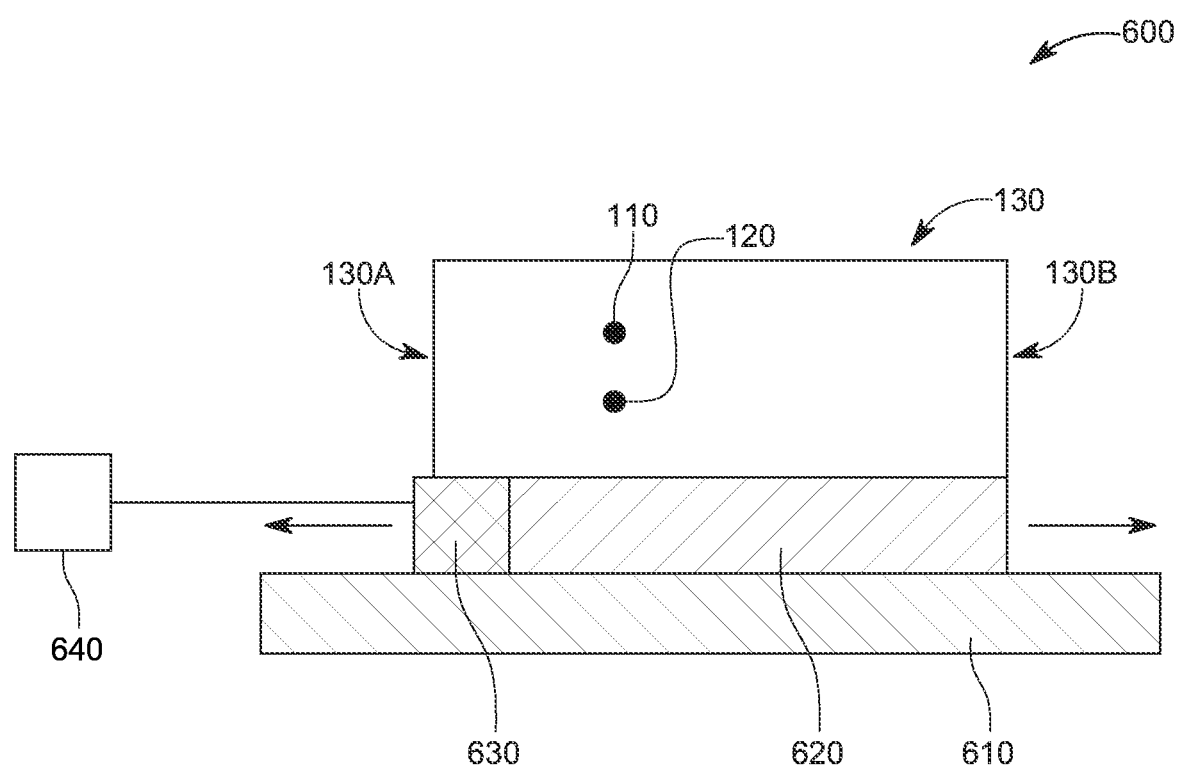
FIG. 6 illustrates a moving mechanism used to move the non-linear crystal, perpendicular to the first and second laser beams.

To move the crystal 130 so that the incoming pump beam 110 and signal beam 120 enter at the correct position (see FIG. 2), a moving mechanism 600 is used, as illustrated in FIG. 6. The moving mechanism 600 includes a fixed platform 610 on top of which a mobile platform 620 can move in opposite directions, as shown by the arrows in the figure. A motor 630 may be attached to one of these two platforms to move the mobile platform 620 relative to the fixed platform 610. The crystal 130 is fixedly attached, by any means, to the mobile platform 620. A computing device 640, for example, a processor and a memory, may be connected in a wired or wireless manner to the motor 630, to adjust and control the moving of the mobile platform 620 relative to the fixed platform. Thus, a user may interact through the computing device 640 with the motor 630 and select a position of the crystal 130 relative to the incoming laser beams 110 and 120, which are fixed in space. Thus, as the crystal 130 is moved to the left in the figure, the output laser beam 140 (not visible in FIG. 6) has the first resulting idler wavelength, and as the crystal 130 is moved to the right in the figure, the laser beam 140 has the second resulting idler wavelength. Depending on the position of the crystal relative to the incoming first and second laser beams 110 and 120, the wavelength of the output laser beam 140 can be adjusted as desired within the wavelength range discussed above. The computing device 640 may also be in communication with the sensor 360 for receiving a measurement from this sensor and detecting one or more elements present in the chamber 364 in FIG. 3A.

Figure 7:
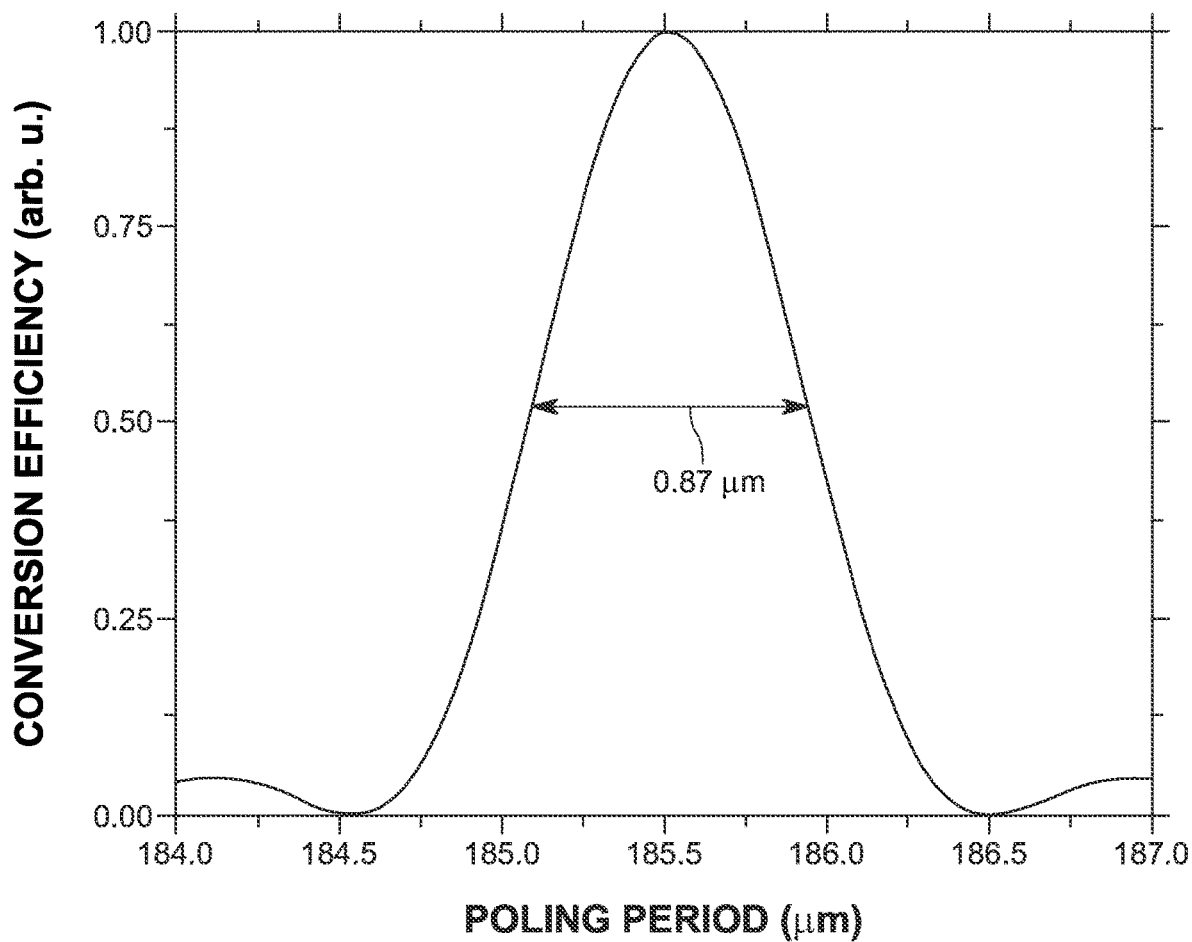
FIG. 7 illustrates the DFG conversion efficiency against the poling period.
Figure 8:
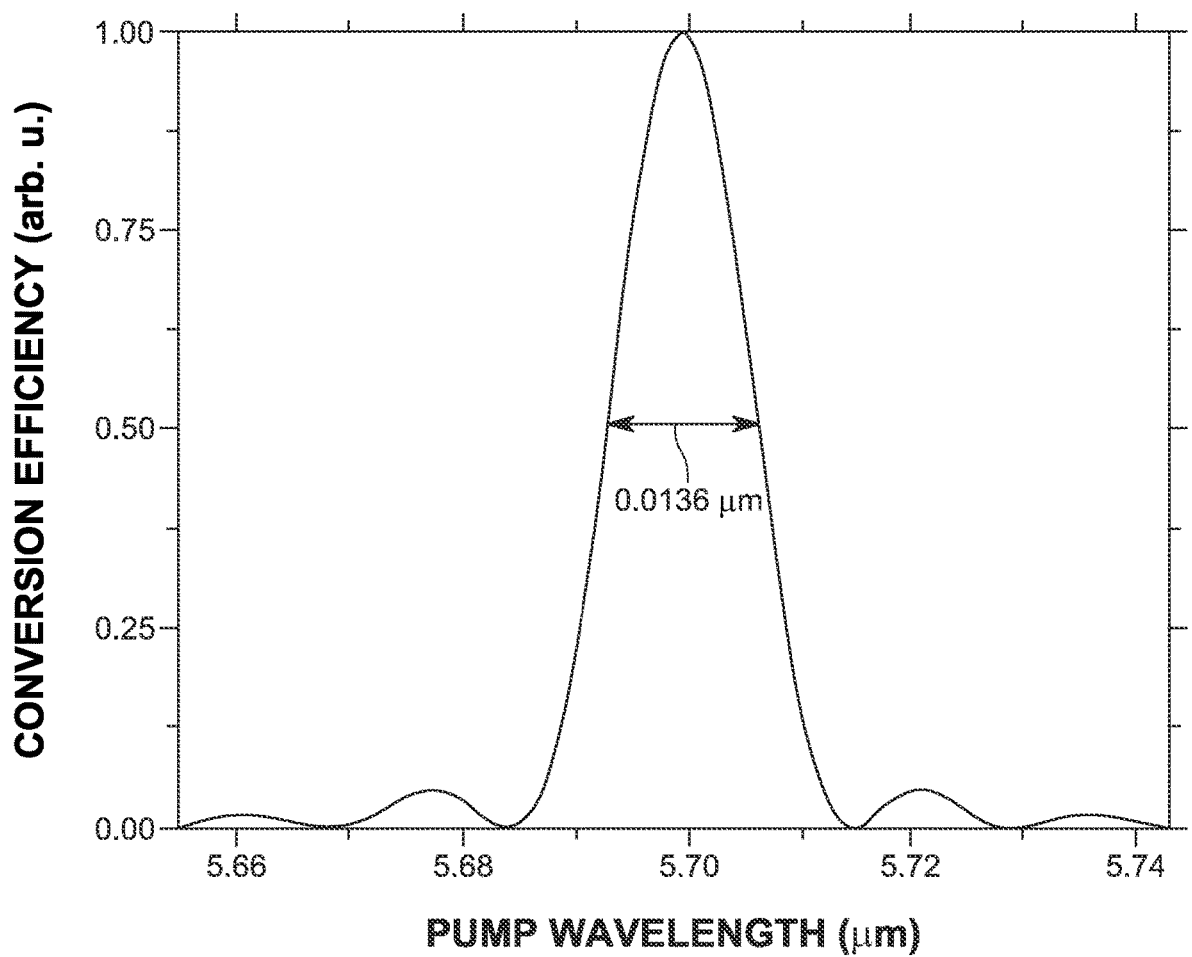
FIG. 8 illustrates the DFG conversion efficiency against the pump laser wavelength at a given poling period.

As discussed above, the width W of the OP—GaAs crystal can be selected to be about 20 mm, which is sufficiently large to discard any efficiency drop due to non-uniform phase-matching conditions across the beams. In particular, when selecting beam diameters over 120 and 200 µm for the pump and signal beams 110 and 120, respectively, the poling period changes by less than 0.2 µm. This value is far below the phase matching bandwidth of 0.87 µm, as shown in FIG. 7, for example, for the case of a poling-period of about 185.5 µm where the pump, signal, and idler wavelengths are 5.7, 9.27, and 14.8 µm, respectively. In this case, the DFG conversion efficiency against the pump laser wavelength is plotted in FIG. 8. The conversion efficiency modifies upon tuning the pump wavelength following the typical since behavior and is characterized by a phase-matching bandwidth of 13.6 nm corresponding, in terms of wavenumbers, to 4.2 cm$^{-1}$. This implies that there is no need to adjust the crystal 130's position upon tuning the pump wavelength, when scanning within a wavenumber range of 4.2 cm$^{-1}$. However, if aiming to scan over the aforementioned range, the pump or/and signal wavelengths as well as the crystal position need to be readjusted. It is possible to automate the setup with the computing device 640 in such a way that the crystal position is continuously adjusted during the pump wavelength scans to preserve phase matching.

Figure 9:
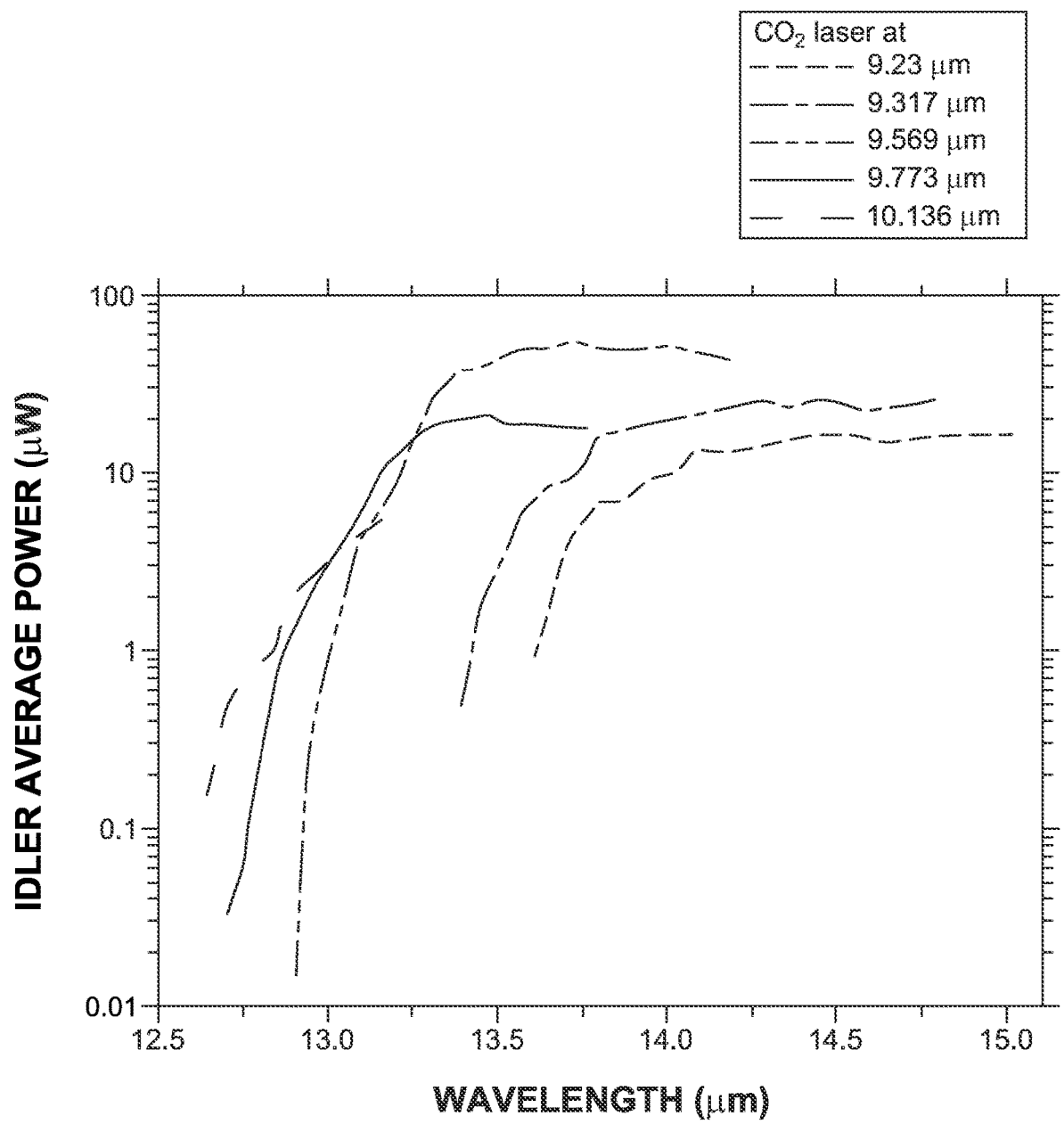
FIGS. 9 and 10 illustrate the DFG average output power at repetition rates of 1 kHz and 2.5 kHz, respectively, for several $CO_2$ gas laser lines when the quantum cascade laser is stepwise tuned.

By combining the large and continuous tunability of the pump laser (EC-QCL) 112 with the multi-line emission of the signal laser ($CO_2$ laser) 122, the obtained idler 140's wavelength ranges between 11.557 µm (865.28 cm$^{-1}$) and 15.002 µm (666.57 cm$^{-1}$). FIG. 9 shows some examples of the average power curves of the idler laser beam 140 at different wavelengths of the $CO_2$ laser 122. For these power measurements, the $CO_2$ laser 122 was operated at a repetition rate of 1 kHz with a duty cycle of 20%. The shape of idler power curves in FIG. 9 follows the power curve of the pump laser 110 shown in FIG. 4. The highest idler output power of about 55 µW has been achieved at an idler wavelength of 13.72 µm. This value can be doubled when the wave-plate 312 is installed after the OI 310 (see FIG. 3A). In particular, the OI 310 causes a rotation by 45° to the polarization of pump laser beam 110. Hence, just 50% of the pump power will effectively contribute to the DFG process in the OP—GaAs crystal. However, installing the WP 312 after the OI 310 rotates the polarization of the pump laser beam back by −45°, and subsequently the pump laser is vertically polarized again. This results in an increased idler laser power by a factor of 100%, compared to the value obtained without installing the WP. The line width of the DFG-based laser source was found to be 2.3 MHz. This corresponds to the width of the convolution between EC-QCL and $CO_2$ emission spectra, which were directly measured against an ultra-narrow optical frequency comb through beating experiments.

Figure 10:
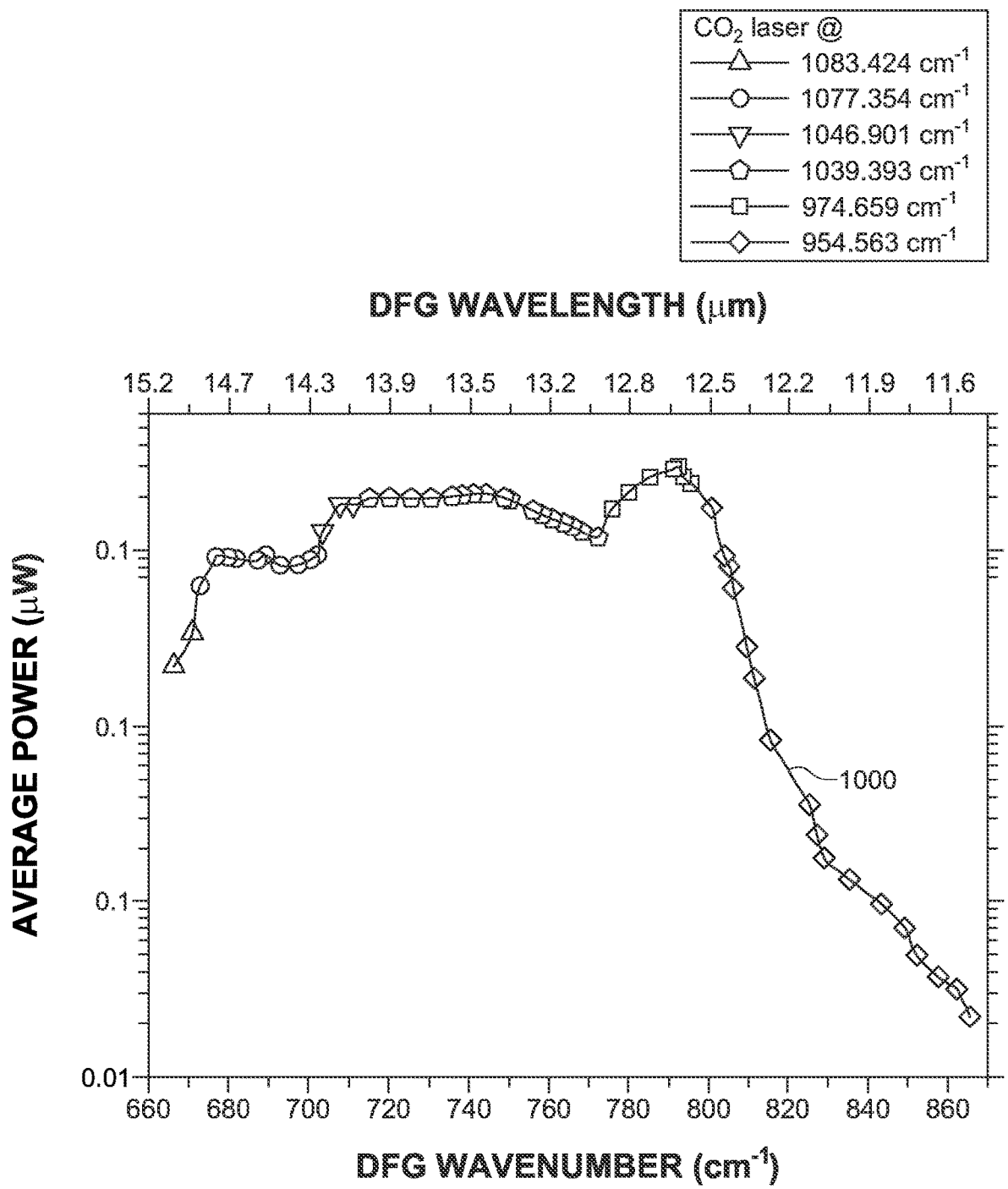
Figure 11:
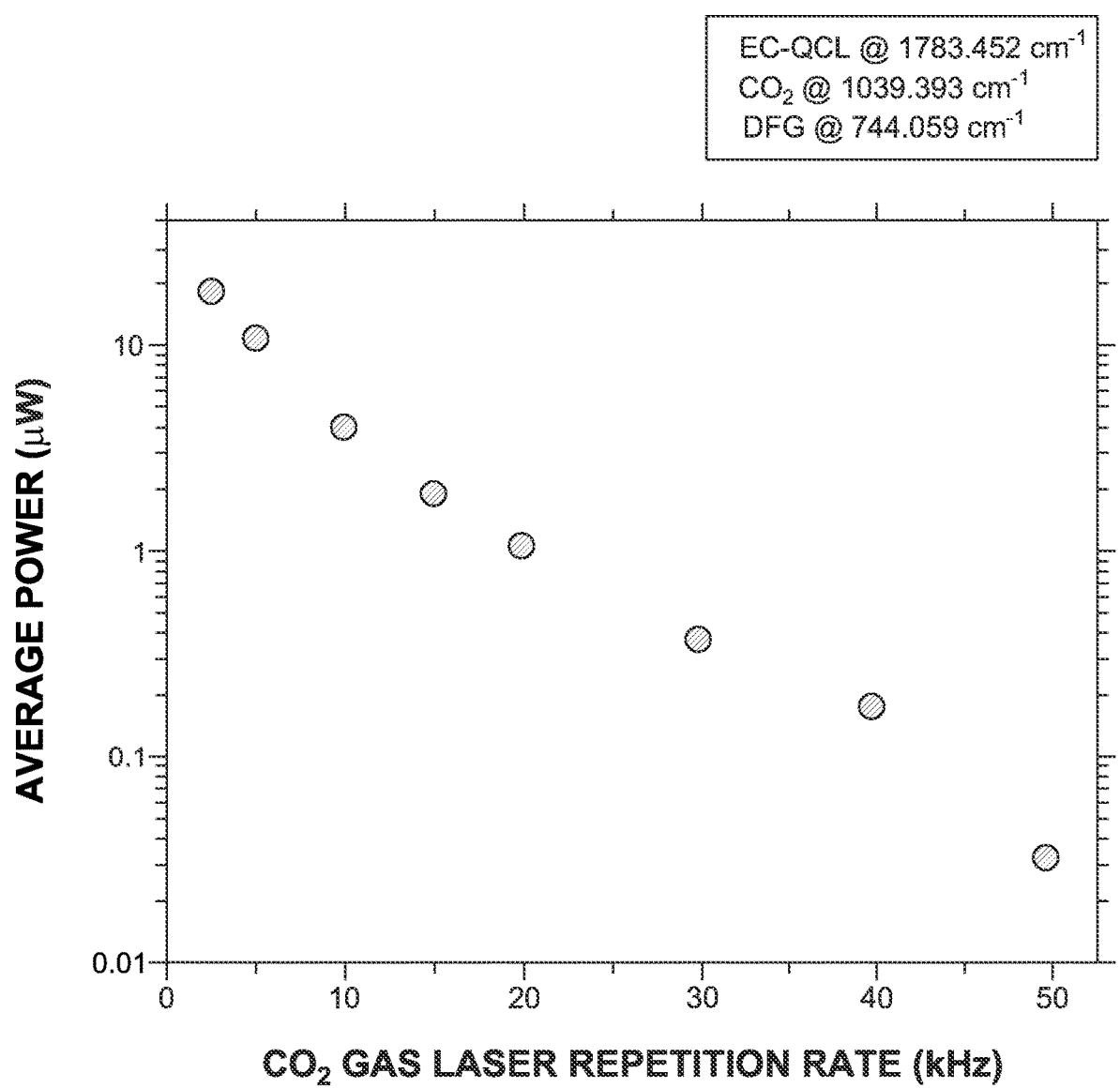
FIG. 11 illustrates the dependency of the idler average output power on the signal pulse repetition rate.

The idler output power was measured using the sensor 360. FIG. 10 shows a representative idler average power curve over the accessible wavenumber range. The data points refer to the idler power values at selected signal laser wavenumbers, while the solid black line 1000 is used as an eye-guide. Here, the signal laser was operated at a repetition rate of 2.5 kHz and a duty cycle of 30%. The $CO_2$ gas laser was set at specific emission lines, while the pump wavelength was stepwise changed through the laser control software. Besides, when the pump laser was tuned to a specific wavelength, the OP—GaAs crystal position was adjusted to optimize the idler laser output power. Thereby, the idler wavenumber can be tuned over a broad range between 666.533 cm$^{-1}$ (15.003 µm) and 865.277 cm$^{-1}$ (11.557 µm). The maximum output power of about 31 µW was measured at 791.766 cm$^{-1}$. The idler output power decreases when the pulse repetition rate of the signal laser is increased to achieve reduced spectral spacing. FIG. 11 shows an example of the nearly exponential dependency of the idler output power on the pulse repetition rate of the $CO_2$ gas laser.

As there is no commercial single-mode-emitting laser covering the wavelength range (11.557-15.002 µm) of the developed laser source 300, there are many possible applications to be explored for this novel source. Furthermore, the already reported works on MIR lasers based on the DFG process in the aforementioned spectral range are accompanied by extremely low optical powers (10-100 nanowatt range) [1]-[3]. None of these lasers can achieve altogether the features of the novel laser source 300 in terms of wavelength range, linewidth, tunability, mode emission, and output power.

Figure 12:
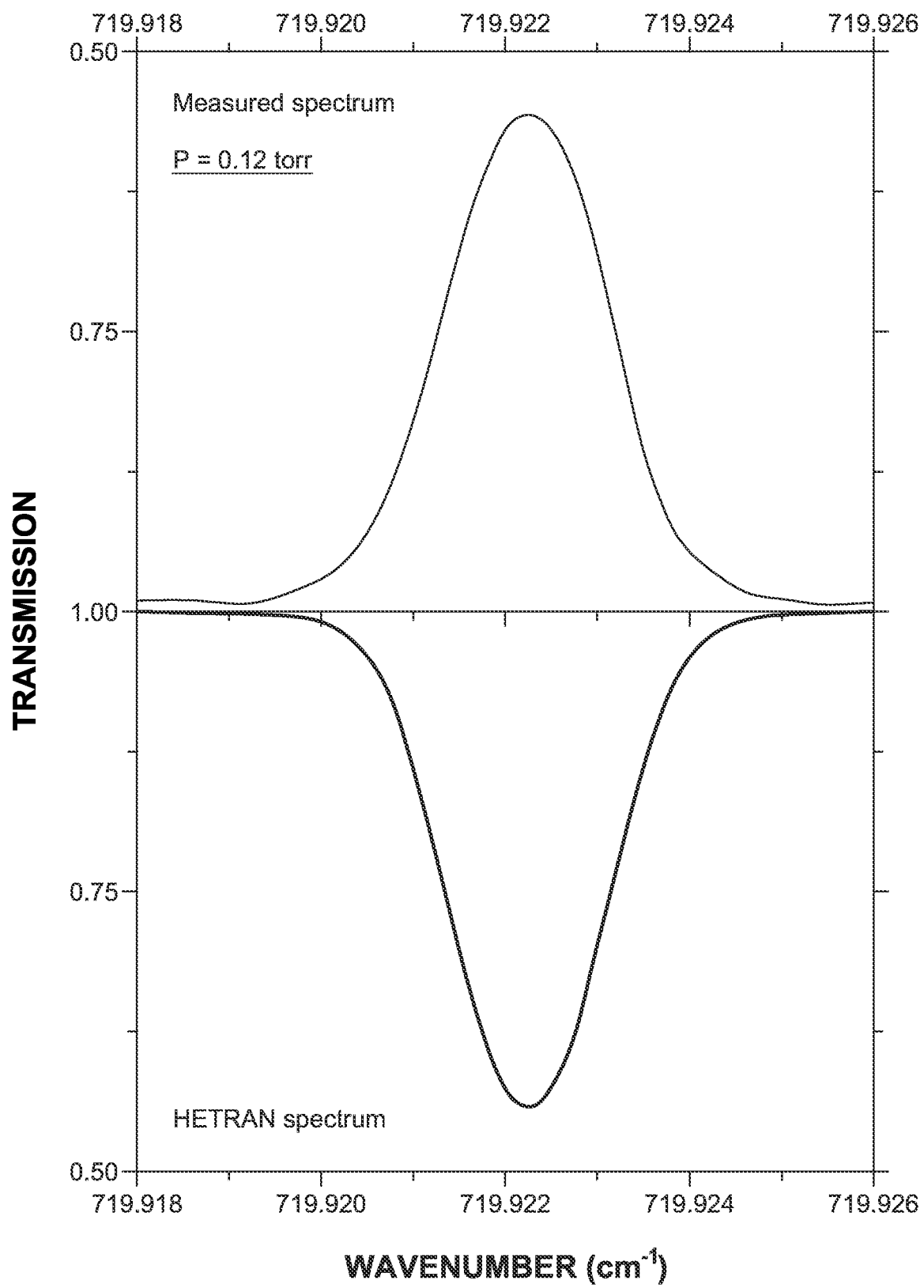
FIG. 12 illustrates a compression between the transmission spectra of acetylene when measured and simulated.

An example of high-resolution spectroscopy measurements carried out using the laser source 300 is shown in FIG. 12. Here, the transmission spectrum of pure acetylene $C_2H_2$ is measured around 719.922 cm$^{-1}$ at a pressure of 0.12 torr and compared with HITRAN simulations (HITRAN: high-resolution transmission molecular absorption database). The obtained spectral spacing of these measurements is in the range of $(2.37-3.37)\times10^{-5}$ cm$^{-1}$, which indicates the high-quality of the laser source 300. Thus, the laser source 300 can be used for chemical detections for any compound (e.g., benzene) or element that responds to the wavelength range discussed above. Other applications of the laser source 300 can be envisioned, for example, in the combustion diagnostic field, for detection of benzene from propargyl radicals. Those skilled in the art would understand, based on the disclosure in this document, that many other applications of the laser source 300 may be found.

Figure 13:
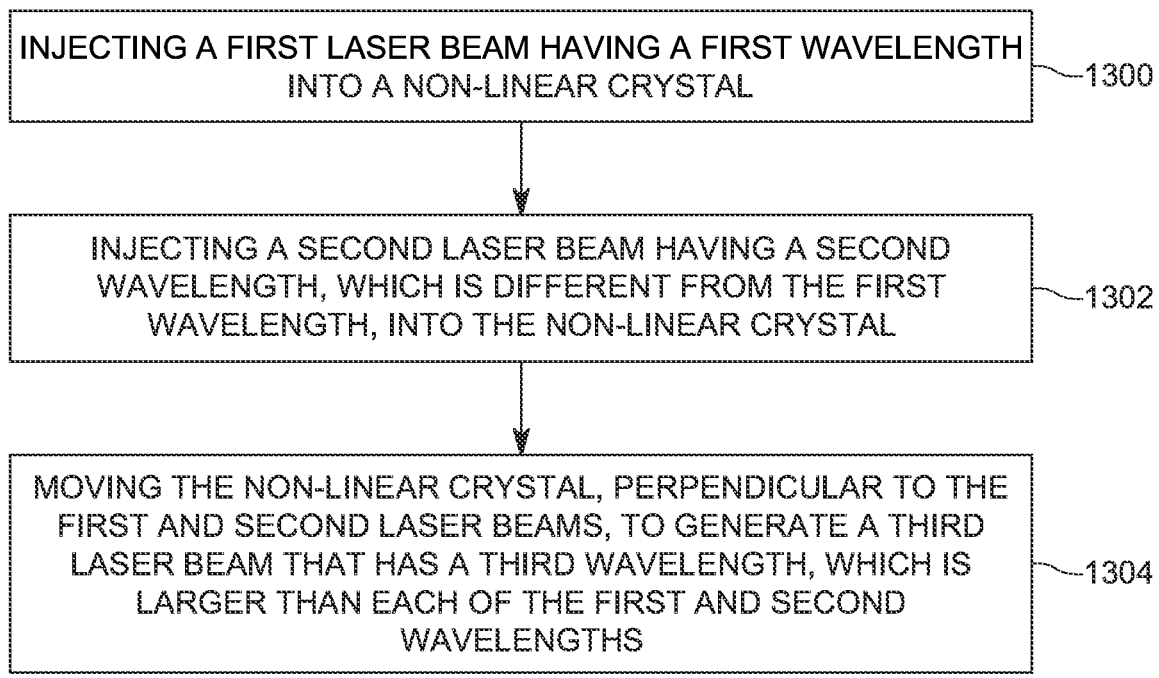
FIG. 13 is a flow chart of a method for measuring a chemical element with the above laser source.

A method for generating a mid-infrared laser beam with the laser source 300 is now discussed with regard to FIG. 13. The method includes a step 1300 of injecting a first laser beam 110 having a first wavelength into a non-linear crystal 130, a step 1302 of injecting a second laser beam 120 having a second wavelength, which is different from the first wavelength, into the non-linear crystal 130, and a step 1304 of moving the non-linear crystal 130, perpendicular to the first and second laser beams 110, 120, to generate a third laser beam 140 that has a third wavelength, which is larger than each of the first and second wavelengths. The non-linear crystal 130 has a length and a width, and a variable poling period across the width so that the third wavelength varies within a given wavelength range.

In one application, a value of the third wavelength depends on the first wavelength, the second wavelength, and a position of the non-linear crystal relative to the first and second laser beams. The non-linear crystal is an orientation-patterned GaAs crystal having a fan-out configuration with a first poling period on one side and a second poling period on an opposite side, and the second poling period is larger than the first poling period. The poling period varies between 181 and 203 µm, the first wavelength varies between 5.45 and 5.71 µm, the second wavelength varies between 9.23 and 10.86 µm, and the given wavelength range is between 11.56 and 15 µm. The length of the non-linear crystal is 35 mm and the width is 20 mm.

The disclosed embodiments provide a laser source that is tunable and generates mid-infrared light with a large wavelength range. It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

The entire content of all the publications listed herein is incorporated by reference in this patent application.

[1] Vainio, M., "Continuous-wave optical parametric oscillators for mid-infrared spectroscopy," Proc. SPIE 1126, 1126419 (2020).
[2] Beutler, M., Rimke, I., Büttner, E., Farinello, P., Agnesi, A., Badikov, V., Badikov, D. and Petrov, V., "Difference-frequency generation of ultrashort pulses in the mid-IR using Yb-fiber pump systems and AgGaSe2," Opt. Express 23, 2730-2736 (2015).
[3] Honzátko, P., Baravets, Y., Mondel, S., Peterka, P. and Todorov, F., "Coherent sources for mid-infrared laser spectroscopy," Proc. SPIE 10142, 1014202 (2016).
[4] Razeghi, M., "High power, high wall-plug efficiency, high reliability, continuous-wave operation quantum cascade lasers at Center for Quantum Devices," Proc. SPIE 11296, 112961C (2020).
[5] Vitiello, M. S., Scalari, G., Williams, B. and De Natale, P., "Quantum cascade lasers: 20 years of challenges," Opt. Express 23, 5167-5182 (2015).

What is claimed is:

1. A laser source comprising:
a first laser device configured to generate a first laser beam having a first wavelength;
a second laser device configured to generate a second laser beam having a second wavelength, which is different from the first wavelength; and
a non-linear crystal configured to receive simultaneously the first and second laser beams and to generate a third laser beam that has a third wavelength, which is larger than each of the first and second wavelengths,
wherein the non-linear crystal has a length and a width, and a variable poling period is distributed across the width so that the third wavelength varies within a given wavelength range based on an incident position of the first and second laser beams along the width of the non-linear crystal, and
wherein the given wavelength range is between 11.56 and 15 µm.

2. The laser source of claim 1, further comprising:
a moving mechanism configured to move the non-linear crystal perpendicular to the first and second laser beams.

3. The laser source of claim 2, wherein a value of the third wavelength depends on the first wavelength, the second wavelength, and the incident position of the first and second laser beams relative to the width of the non-linear crystal.

4. The laser source of claim 1, wherein the non-linear crystal is an orientation-patterned GaAs crystal.

5. The laser source of claim 4, wherein the orientation-patterned GaAs crystal has a fan-out configuration with a first poling period on one side and a second poling period on an opposite side, and the second poling period is larger than the first poling period.

6. The laser source of claim 4, wherein the first laser device is an external cavity or a distributed-feedback quantum cascade laser, and the second laser device is a $CO_2$ gas laser.

7. The laser source of claim 1, wherein the poling period varies between 181 and 203 µm, the first wavelength varies between 5.45 and 5.71 µm, and the second wavelength varies between 9.23 and 10.86 µm.

8. The laser source of claim 1, wherein the length of the non-linear crystal is 35 mm and the width is 20 mm.

9. The laser source of claim 1, further comprising:
an optical isolator configured to receive the first laser beam and rotate a polarization direction of the first laser beam with a given angle; and
a wave-plate that receives the first laser beam after passing the optical isolator and is configured to rotate the polarization direction of the first laser beam with an opposite value of the given angle.

10. The optical source of claim 9, further comprising:
a first pair of concave mirrors placed downstream the wave-plate, along the first laser beam; and
a second pair of concave mirrors placed downstream the second laser device, along the second laser beam,
wherein the first and second pairs of concave mirrors control a waist of the first and second laser beams, respectively.

11. The optical source of claim 10, further comprising:
a beam combiner configured to combine and align the first and second laser beams,
wherein the beam combined is placed downstream the first and second pairs of concave mirrors and upstream the non-linear crystal.

12. The optical source of claim 11, further comprising:
a parabolic mirror placed downstream the beam combiner and upstream the non-linear crystal, and configured to focus the first and second laser beams on the non-linear crystal.

13. A method for generating a mid-infrared laser beam with a laser source, the method comprising:
injecting a first laser beam having a first wavelength into a non-linear crystal;
injecting a second laser beam having a second wavelength, which is different from the first wavelength, into the non-linear crystal; and
moving the non-linear crystal, perpendicular to the first and second laser beams, to generate a third laser beam that has a third wavelength, which is larger than each of the first and second wavelengths,
wherein the non-linear crystal has a length and a width, and a variable poling period is distributed across the width so that the third wavelength varies within a given wavelength range, and wherein the given wavelength range is between 11.56 and 15 μm.

14. The method of claim 13, wherein a value of the third wavelength depends on the first wavelength, the second wavelength, and an incident position of the first and second laser beams relative to the non-linear crystal.

15. The method of claim 13, wherein the non-linear crystal is an orientation-patterned GaAs crystal having a fan-out configuration with a first poling period on one side and a second poling period on an opposite side, and the second poling period is larger than the first poling period.

16. The method of claim 13, wherein the poling period varies between 181 and 203 μm, the first wavelength varies between 5.45 and 5.71 μm, and the second wavelength varies between 9.23 and 10.86 μm.

17. The method of claim 13, wherein the length of the non-linear crystal is 35 mm and the width is 20 mm.

18. A sensing system comprising:
a laser source configured to generate a mid-infrared laser beam based on (1) a first laser device, which generates a first laser beam having a first wavelength, (2) a second laser device, which generates a second laser beam having a second wavelength, which is different from the first wavelength, and (3) a non-linear crystal that receives simultaneously the first and second laser beams and generates a mid-infrared laser beam having a third wavelength, which is larger than each of the first and second wavelengths;
a moving mechanism configured to move the non-linear crystal along a direction perpendicular to the first and second laser beams to change the third wavelength within a given wavelength range, which is defined by an incident position of the first and second laser beams along the width of the non-linear crystal, and the given wavelength is between 11.56 and 15 μm;
a chamber configured to receive a chemical element to be measured, wherein the mid-infrared laser beam is configured to enter the chamber; and
a sensor configured to receive the mid-infrared laser beam after exiting the chamber and also configured to determine a wavelength or intensity of the mid-infrared laser beam.

19. The sensing system of claim 18, wherein the non-linear crystal has a length and a width, and a variable poling period is distributed across the width so that the third wavelength varies within the given wavelength range.

* * * * *